United States Patent [19]

Hofstetter et al.

[11] Patent Number: 5,437,242
[45] Date of Patent: Aug. 1, 1995

[54] PROCESS AND APPARATUS FOR CONTROLLING THE MELT LEVEL WHILE PULLING SINGLE CRYSTALS

[75] Inventors: Christian Hofstetter, Burghausen; Walter Berger, Simbach am Inn; Werner Bauer; Bernd Mittelbach, both of Burghausen, all of Germany

[73] Assignee: Wacker-Chemitronic Gessellschaft fuer Elektronik-Grundstoffe mbH, Burghausen, Germany

[21] Appl. No.: 108,897

[22] Filed: Aug. 18, 1993

[30] Foreign Application Priority Data

Sep. 17, 1992 [DE] Germany .............. 42 31 162.4

[51] Int. Cl.$^6$ .............................. C30B 15/26
[52] U.S. Cl. ........................ 117/14; 117/15; 117/30; 117/201; 117/208; 117/217
[58] Field of Search ............ 117/14, 15, 30, 201, 117/208, 217

[56] References Cited

U.S. PATENT DOCUMENTS

| | | | |
|---|---|---|---|
| 3,692,499 | 9/1972 | Andrychuk | 117/14 |
| 4,330,362 | 5/1982 | Zulehner | 117/14 |
| 4,350,557 | 9/1982 | Scholl et al. | |
| 4,454,096 | 6/1984 | Lorenzini et al. | 117/14 |
| 4,915,775 | 4/1990 | Katsuoka et al. | 117/14 |
| 5,170,061 | 12/1992 | Baba | 117/14 |

FOREIGN PATENT DOCUMENTS

| | | |
|---|---|---|
| 0183221 | 6/1986 | European Pat. Off. |
| 0472907 | 3/1992 | European Pat. Off. |
| 62-87481 | 4/1987 | Japan ........................ 117/14 |

OTHER PUBLICATIONS

Patent Abstract of Japan, C. Field, vol. 13, No. 273, Jun. 22, 1989 The Patent Office Japanese Government, p. 157 C 609.
Patent Abstracts of Japan, C. Field, vol. 9, No. 171, Jul. 16, 1985 The Patent Office Japanese Government, p. 66 C 291, No. 60-42 294.
Patent Abstracts of Japan, C. Field, vol. 9, No. 171, Jul 16, 1985 The Patent Office Japanese Government, p. 66 C 291, No. 60-42 296.

*Primary Examiner*—Robert Kunemund
*Attorney, Agent, or Firm*—Collard & Roe

[57] ABSTRACT

A process and an apparatus for carrying out the process provides for the accurate and simple control of the melt level when pulling single crystals according to the Czochralski process. The process comprises disposing a mechanical reference mark above the melt in such a way that it causes a reflection from the melt surface. An image of the metal surface is then recorded, and with the aid of the recorded image the distance of the mechanical reference mark from the melt surface is determined. An actual signal proportional to this distance is then generated and is compared with a set point signal, and the melt level is changed as a function of any difference observed.

5 Claims, 2 Drawing Sheets

5,437,242

PROCESS AND APPARATUS FOR CONTROLLING THE MELT LEVEL WHILE PULLING SINGLE CRYSTALS

BACKGROUND OF THE INVENTION

1. Field of the Invention

The present invention relates to a process and apparatus for controlling the melt level while pulling a single crystal from a melt according to the Czochralski process.

2. The Prior Art

When growing crystals according to the Czochralski process, a rod-shaped single crystal is grown from a seed. The single-crystal seed is brought into contact with a melt situated in a crucible and is slowly pulled away from the melt surface in an axial direction. In the process, molten material continually crystallizes at the interface between the single crystal and the melt and increases the volume of the single crystal. The pulling process is generally discontinued when the supply of molten material has been used up or a predefined crystal size has been reached. The success of crystal growing depends especially on regulating the temperature and the mass streams in the melt and in the gas space above the melt. The level of the melt surface with respect to an existing or an imaginary reference level has a decisive influence thereon, and the control of the melt level deserves particular attention.

Precise knowledge of the melt level is required, according to U.S. Pat. No. 4,915,775, so as to be able to set the crystal diameter as accurately as possible. It is therefore desirable to check the melt level during the entire pulling process, if possible, and to change it if necessary. Normally, the melt level, which would drop as liquid material is consumed, is kept constant by raising the crucible axially, in order to maintain the relative position of the heating elements, which are arranged to the side of the crucible, with respect to the melt surface. Recharging the crucible with solid or molten material can also be used to influence the melt level. By using this prior art process, a plurality of crystals can be pulled almost continuously. In the patent mentioned, the melt level is determined by measuring the time required to lower the seed crystal from a reference position until contact with the melt surface is achieved. A disadvantage of this method is that the melt level can be measured only once, prior to pulling the crystal, and cannot be measured continuously.

According to U.S. Pat. No. 4,454,096, the measurement of the melt level is achieved by directing a light beam onto the melt surface and having a sensor to register the light reflected by the surface. However, in this prior art method, the determination of the melt level of molten material in a reservoir crucible can be carried out only with great difficulty in a pulling crucible, because the single crystal obstructs the beam path.

The situation becomes even more problematic if a pulling process is practiced such as is described in U.S. Pat. No. 4,330,362. Here, there is a partial or virtually complete cover above the crucible from which the crystal is being pulled. Hence, it is virtually impossible to configure a light source irradiating the melt surface in combination with a sensor registering the reflected light.

SUMMARY OF THE INVENTION

It is an object of the present invention to provide a process and an apparatus for controlling the melt level in a crucible while pulling a single crystal from a melt according to the Czochralski process, according to which the melt level can be determined and controlled by simple means, continuously and at high accuracy, while overcoming the problems mentioned above.

The above object is achieved according to the present invention by providing a process for controlling the melt level of molten material in a crucible while pulling a single crystal according to the Czochralski process. The process of the invention includes arranging at least one mechanical reference mark above the melt in such a way that it causes a reflection from the melt surface. An image of an evaluation area which contains the reflection, at least in part, is recorded from the melt surface. The distance of the mechanical reference mark from the melt surface is determined with the aid of the recorded image, and an actual signal proportional to this distance is generated. The actual signal is then compared with a predefined set point signal. If a difference is observed, a control signal is generated to change the melt level.

The above object is further achieved by an apparatus for controlling a melt level in a crucible while pulling a single crystal according to the Czochralski process. The apparatus includes at least one mechanical reference mark which is disposed above a melt in such a way that it causes a reflection from the melt surface. An optical recording device records an image of a predefined evaluation area, which contains the reflection, at least in part, on the melt surface. An electronic image-processing device, with the aid of the recorded image, determines the distance of the mechanical reference mark from the melt surface and produces an actual signal proportional to this distance. A set point generator outputs a set point signal proportional to a defined distance of the mechanical reference mark from the melt surface. A control device then compares the actual signal with the set point signal. If a difference is observed, it generates a control signal to change the melt level.

The process of the invention utilizes the discovery that objects can be placed above the crucible in such a way that they cause a reflection from the melt surface. According to the rules of geometrical optics, there is a linear relationship between the geometry of the reflection and the geometry of the object. By observing the reflection it is therefore possible to determine the distance of the object from the melt surface and thus the melt level, and to control it while pulling the crystal. As the position of the object can also be used as a reference variable for the melt level, the object is hereinafter called "mechanical reference mark." The transition: reflection→reflection-free melt surface is accompanied by a marked change in brightness, so that the reflection stands out clearly from the surrounding melt surface. This transition is always contained in the evaluation area selected for the melt level control. Obviously it is not necessary to evaluate the entire reflection caused by the mechanical reference mark for the purpose of melt level control. It is sufficient if at least part of the reflection falls into the evaluation area.

It is desirable to design the shape of the mechanical reference mark in such a way that it has at least one characteristic, geometrical feature which can be quickly recognized especially within the reflection. Suitable recognition features, in particular, are simple geometric figures such as triangles, quadrangles or circles. It does not matter whether the feature has been implemented, for example, as a round disk or as a round hole in a body of any shape. In both instances, the reflection generated can be used to determine the distance of the mechanical reference mark from the melt surface. The reflections are distinguished only in that in the first case a change in brightness is observed in the transition: disk-shaped reflection→reflection-free melt surface. In the other case a change in brightness is observed in the transition: disk-shaped, reflection-free melt surface→reflection.

The mechanical reference mark must be made from a material which is stable at the temperatures prevailing during crystal-pulling. Preferably, materials are used whose thermal expansion is small, so that only a small correction factor has to be taken into account when controlling the melt level. As the process according to the invention is particularly suitable for pulling silicon single crystals for semiconductor purposes, it is advisable, in addition, to use materials which do not give off impurities, or which do so only in tolerable amounts, to ensure that the crystal is not contaminated and its single-crystal growth is not impeded. Ceramic materials, metals or metal alloys containing molybdenum or tungsten are particularly suitable.

In a particularly advantageous embodiment of the process, conventional crucible covers, as described in U.S. Pat. No. 4,330,362, are used as mechanical reference marks. Such covers, as a rule, have a circular hole which concentrically surrounds the growing single crystal. The reflection from the melt surface consequently likewise has a circular contour. In a preferred embodiment the cover is provided with an additional recognition feature, for example by the hole being enlarged at a particular point in a defined and characteristic manner.

If the geometrical data of the mechanical reference mark, for example the diameter of the hole in the cover or the geometry of the additional recognition feature, are known, then the distance of the mechanical reference mark from the melt surface, and the melt level in relation to the position of the mechanical reference mark, can be calculated in absolute terms according to the rules of geometrical optics with the aid of a recorded image of the reflection observed. The angle of vision, at which the reflection is observed, of course enters into the calculation. An absolute calculation is also possible by utilizing similarity relationships of a mechanical reference mark or parts thereof to a standard reference mark whose geometrical data are known.

The distance of the mechanical reference mark from the melt surface does not necessarily have to be determined in absolute terms. It is often sufficient to carry out a calibration and to compare the reflection recorded in a particular evaluation area with a set of calibrated images of the reflection. During calibration, images of the reflection in a particular evaluation area are recorded as a function of varying distances of the mechanical reference mark from the melt surface. A defined value to which all the other distances relate is assigned to one of the distances. If, in the course of the comparison, a recorded image agrees with a calibrated image, the distance to be found, of the mechanical reference mark from the melt surface, is equal to that assigned to the calibrated image.

The melt surface and the reflection therefrom are recorded with an optical recording device, for example, with a CCD camera or with a photosensitive diode array. The brightness of the recording is registered pixel by pixel and is evaluated electronically. Naturally, it is desirable to use the image data supplied by the optical recording device not only for the purpose of melt level control according to the invention, but also for the crystal diameter determination described in the prior art. The analysis of the recorded image for the purpose of melt level control in the first place involves the step of considering a pixel of the evaluation area to form part of the reflection if the brightness within this pixel is within predefined limit values. Similar considerations apply to pixels which are to be considered as forming part of the reflection-free melt surface. The reflection of a selected evaluation area is then employed from the image thus processed in order to calculate electronically, according to the rules of geometrical optics, the distance between the mechanical reference mark and the melt surface. If an absolute calculation of the distance is not possible, the distance is determined by comparing the image with a set of calibrated images. Finally, the image processing device outputs an actual signal current which is proportional to the distance found.

With the aid of this actual signal current, the distance of the mechanical reference mark from the melt surface and thus the melt height can be controlled. The actual signal serves as an input variable for a control device. There it is compared to a set point signal which is proportional to a desired distance of the mechanical reference mark from the melt surface. The set point signal is preferably output by a computer as the set point generator to the control device. The control device compares the actual signal with the set point signal and, in accordance with the difference observed, generates a control signal with the aid of which the melt level can be changed. By selecting the set point signal accordingly, the melt level can be kept constant while the crystal is pulled or the melt level can be varied according to a defined program.

In principle, however, it would also be possible to dispense with electronic aids, at least in part, for the purpose of controlling the melt level. In order to be able, for example, to keep constant the distance of the mechanical reference mark from the melt surface, it may be sufficient in certain circumstances to keep a close watch for changes in the reflection evaluation area recorded by the camera. If changes occur, the melt level must be changed until the original reflection image is produced once more. As a rule, however, automated control of the melt level is to be preferred to this procedure.

As it is very simple to control the melt level by the movement of the crucible, a control signal is preferably generated which raises or lowers the crucible as a function of the deviation of the actual signal from the set point signal until the deviation has been canceled. Another embodiment is to change the melt level by a control signal which influences the infeed of solid or molten material into the melt crucible. However, the melt level cannot be lowered in this manner.

BRIEF DESCRIPTION OF THE DRAWINGS

Other objects and features of the present invention will become apparent from the following detailed description considered in connection with the accompanying drawings which disclose embodiments of the present invention. It should be understood, however, that the drawings are designed for the purpose of illustration only and not as a definition of the limits of the invention.

In the drawings, wherein similar reference characters denote similar elements throughout the several views:

FIG. 2b is a perspective view, on an enlarged scale, of the area IIB of FIG. 2a.

DETAILED DESCRIPTION OF PREFERRED EMBODIMENTS

Figure 1:
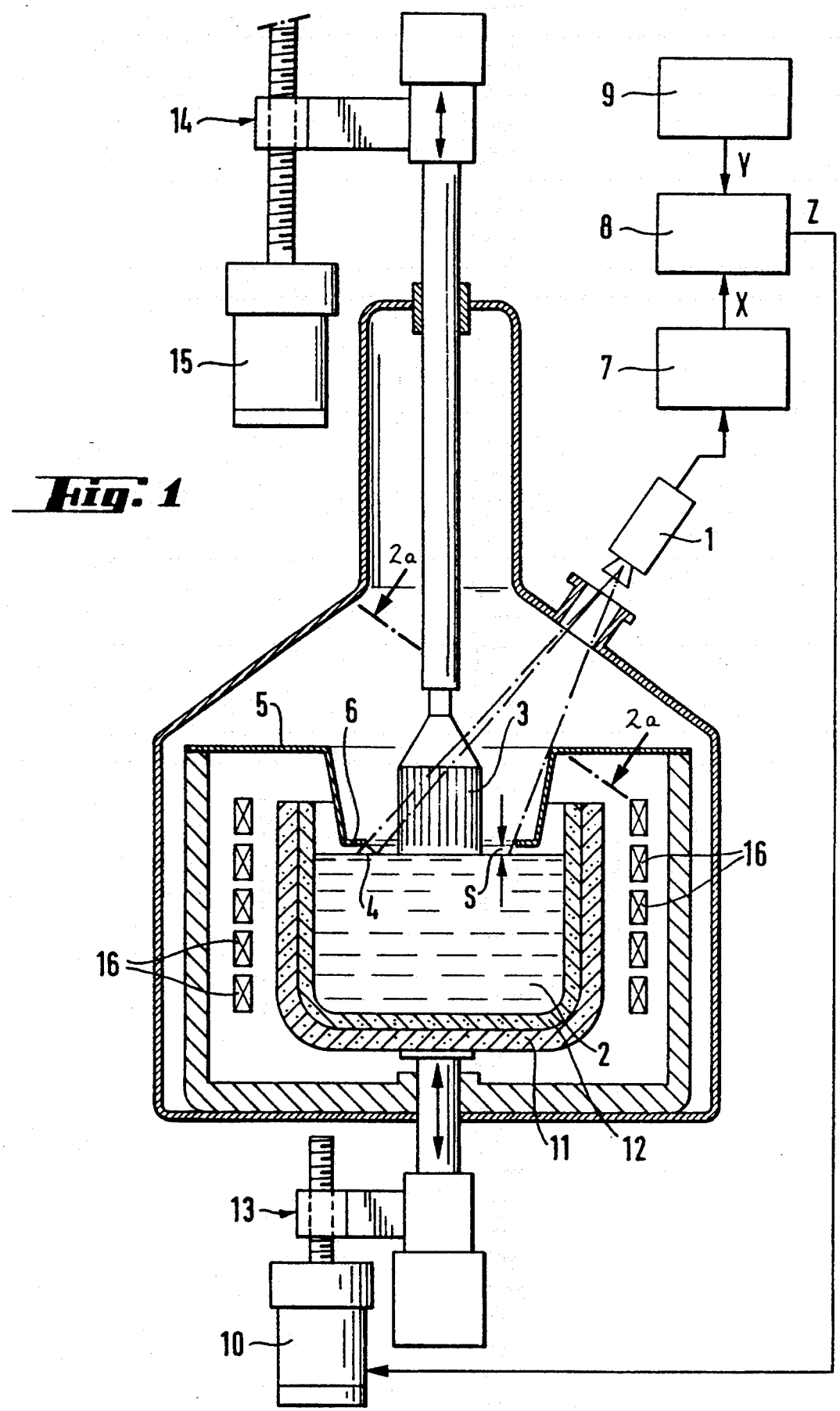
FIG. 1 is a diagram, partly in section and partly in block form, of an apparatus for pulling single crystals according to the Czochralski process, having the improvements of the invention.

Turning now in detail to the drawings, FIG. 1 shows the optical recording device 1 being directed onto the surface of the melt 2 in such a way that both the region of the phase boundary between the single crystal 3 and the melt and the region of the melt surface on which the reflection 4 is located can be observed. The mechanical reference mark in this preferred embodiment is fashioned as a pot-shaped cover 5. Between the rim 6 of the cover 5 which coaxially encircles the growing single crystal and the periphery of the single crystal there is a gap several millimeters wide, through which the reflection 4 can be observed. It is caused by the rim 6, which is parallel to the melt surface of the cover 5. The evaluation area selected is recorded by the optical recording device 1, for example a CCD camera, and electronically processed in a downstream image-processing device 7. In the first instance, this involves distinguishing, with the aid of the brightness values measured, for each individual pixel which forms part of the evaluation area selected, whether it represents the reflection or the reflection-free melt surface. Based on this information, the distance S of the cover rim from the melt surface is determined, taking into account the stored geometrical data of the mechanical reference mark (in this case the diameter of the cover rim is sufficient for an absolute calculation) or of a stored set of calibrated images of the evaluation area. The image-processing device outputs an actual signal X proportional to the current actual distance. The actual signal is then compared, in a control device 8, with a predefined set point signal Y which is proportional to the desired distance. Control device 8 can be any known comparator. The set point signal is stored, for example, in a computer serving as the set point generator 9 and is output, as required, to the control device. If a deviation is observed, the control device generates a control signal Z for the drive motor 10 which changes the vertical position of the crucible, comprising an outer graphite receiver 11 and an inner quartz crucible 12, with the aid of the raising and lowering mechanism 13 until the actual signal and the set point signal agree. Preferably, the melt level is controlled to a constant value, so that the distance S of the cover from the melt surface does not change. The single crystal can then be pulled from the melt by the pulling mechanism 14 which is moved by the motor 15. This ensures that the position of the heating elements 16 disposed at the side of the crucible does not change with respect to the melt level, although the amount of molten material continually decreases in line with crystal growth.

Figure 2A:
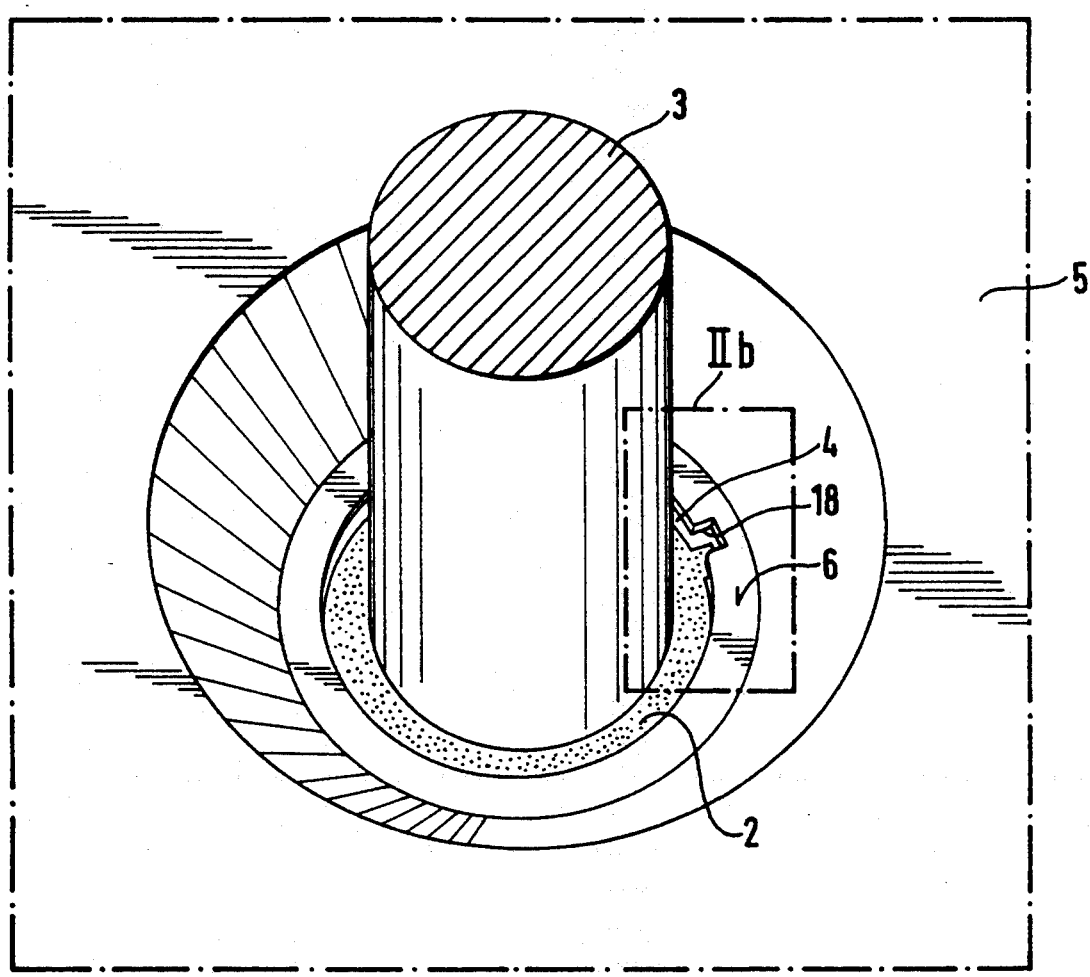
FIG. 2a is a perspective view, on an enlarged scale, partly in section, of FIG. 1, taken along the sectional lines A—A of FIG. 1, seen obliquely from above.

FIG. 2a shows section view of the apparatus along the sectional line A—A of FIG. 1, as seen obliquely from above. Because of the cover 5, a portion of the melt surface 2 cannot be seen. The rim 6 of the cover encircles the growing single crystal 3 and causes, on the melt surface, a reflection 4 which, in terms of its brightness value, can be distinguished from the reflection-free regions of the melt surface.

Figure 2B:
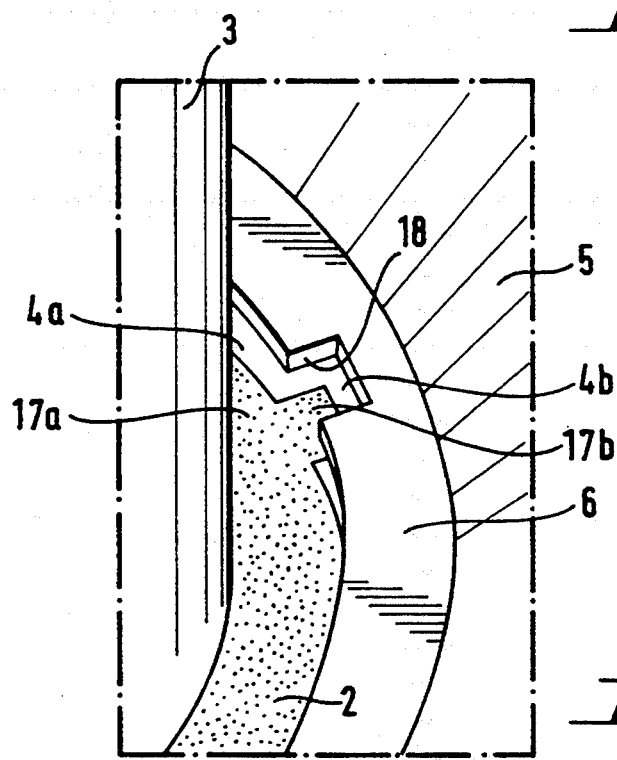

FIG. 2b shows an enlarged rectangular detail IIb from FIG. 2a. Any region is suitable as an evaluation region for controlling the melt level according to the process of the invention, which contains at least a portion of the reflection 4a caused by the rim 6 of the cover 5 and the reflection-free melt surface 17a surrounding this portion. Preferably, however, an evaluation area is selected in which a distinctive reflection 4b results from a rectangular slot 18 having been produced at the rim of the cover. If this characteristic shape feature is present in the cover, it can also be found when looking at the reflection 4b and the reflection-free melt surface 17b.

The process according to the invention and the apparatus for carrying it out permit accurate and simple control of the melt level. It is equally suitable for continuous and intermittent growth of single crystals and is not subject to any limitation if the melt is partially covered for particular reasons.

While an embodiment of the present invention has been shown and described, it is to be understood that many changes and modifications may be made thereunto without departing from the spirit and scope of the invention as defined in the appended claims.

What is claimed is:

1. A process for controlling the melt level of molten material in a crucible covered by a crucible cover while pulling a single crystal according to the Czochralski process, comprising:
   a) providing said crucible cover with at least one characteristic shaped portion in a distance S to the melt surface, said shaped portion causing a reflection from the melt surface;
   b) recording an image of an evaluation area from the melt surface, said evaluation area, at least in part, containing said reflection;
   c) determining with the aid of the recorded image said distance S and generating an actual signal proportional to this distance;
   d) comparing the actual signal with a set point signal and, if a difference is observed, generating a control signal to change the melt level.

2. The process as claimed in claim 1, comprising generating a control signal by means of which the melt level is changed by raising or lowering of the crucible.

3. The process as claimed in claim 1, comprising generating a control signal by means of which the melt level is changed by feeding of material to be melted or already molten into the crucible.

4. An apparatus for controlling the melt level of molten material in a crucible covered by a crucible cover while pulling a single crystal according to the Czochralski process, comprising:
   a) said crucible cover having at least one characteristic shaped portion in a distance S to the melt surface, said shaped portion causing a reflection from the melt surface;

b) an optical recording device which records an image of an evaluation area from the melt surface, said evaluation area, at least in part, containing said reflection;

c) an electronic image-processing device which determines with the aid of said recorded image the distance S and generates an actual signal proportional to said distance S;

d) a set point generator which generates a set point signal proportional to a predetermined value; and (e) a control device which compares the actual signal with the set point signal and, if a difference is observed, generates a control signal to change the melt level.

5. The apparatus as claimed in claim 4, wherein the optical recording device is a CCD camera.

* * * * *